(12) United States Patent
Akiyama et al.

(10) Patent No.: US 12,218,167 B2
(45) Date of Patent: Feb. 4, 2025

(54) SOLID-STATE IMAGING DEVICE AND ELECTRONIC DEVICE

(71) Applicant: SONY SEMICONDUCTOR SOLUTIONS CORPORATION, Kanagawa (JP)

(72) Inventors: Kentaro Akiyama, Kanagawa (JP); Junichiro Fujimagari, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 570 days.

(21) Appl. No.: 17/281,452

(22) PCT Filed: Aug. 16, 2019

(86) PCT No.: PCT/JP2019/032182
§ 371 (c)(1),
(2) Date: Mar. 30, 2021

(87) PCT Pub. No.: WO2020/075388
PCT Pub. Date: Apr. 16, 2020

(65) Prior Publication Data
US 2021/0408097 A1    Dec. 30, 2021

(30) Foreign Application Priority Data
Oct. 11, 2018  (JP) .................................. 2018-192451

(51) Int. Cl.
*H01L 27/146*    (2006.01)
(52) U.S. Cl.
CPC .. *H01L 27/14636* (2013.01); *H01L 27/14634* (2013.01); *H01L 27/1469* (2013.01)
(58) Field of Classification Search
CPC ......... H01L 27/14601; H01L 27/14636; H01L 27/14634; H01L 27/14643;
(Continued)

(56) References Cited

U.S. PATENT DOCUMENTS

2010/0155582 A1* 6/2010 Hirano .............. H01L 27/14618
257/E31.127
2011/0127631 A1 6/2011 Kawashima
(Continued)

FOREIGN PATENT DOCUMENTS

CN    102110696 A    6/2011
CN    102214618 A    10/2011
(Continued)

OTHER PUBLICATIONS

Wakiyama et al., Solid-State Imaging Device, Manufacturing Method, and Electronic Device, Sep. 23, 2016, machine translation of JP 2016-171297, pp. 1-26. (Year: 2016).*

(Continued)

*Primary Examiner* — Natalia A Gondarenko
(74) *Attorney, Agent, or Firm* — CHIP LAW GROUP

(57) ABSTRACT

To provide a solid-state imaging device capable of further improving quality. Provided is a solid-state imaging device including: a first semiconductor element having a first semiconductor layer provided with a first through via and a photoelectric conversion unit configured to photoelectrically convert light that has been incident, a connection part that is wider than the first through via and is provided outside a region where the photoelectric conversion unit is provided on a surface of the first semiconductor layer on a side for receiving the light, connection wiring provided on the surface and configured to connect the first through via and the connection part, and a first passivation layer formed on the surface side; a second semiconductor element mounted on the first semiconductor element by the connection part; and a first guard ring formed on an outer peripheral portion of the first semiconductor element to surround the first semiconductor element. In the solid-state imaging device, at least a part of the first guard ring is arranged outside the first semiconductor layer and above a second semiconductor (Continued)

layer formed in substantially the same layer as the first semiconductor layer, and the first guard ring is arranged outside the first passivation layer and below a second passivation layer formed in substantially the same layer as the first passivation layer.

11 Claims, 7 Drawing Sheets

(58) Field of Classification Search
CPC ......... H01L 27/14625; H01L 27/14607; H01L 27/14685; H01L 27/1469; H01L 23/3114; H01L 23/522; H01L 23/528; H01L 23/5283; H01L 23/5226; H01L 23/5329; H01L 23/5384; H01L 23/5386; H01L 23/345; H01L 23/481; H01L 21/3205; H01L 21/768; H01L 24/04; H01L 24/05–09; H01L 24/10; H01L 24/12; H01L 24/14; H01L 24/16; H01L 25/0657; H04N 25/70; H04N 25/7013; H04N 25/709; H04N 25/71; H04N 25/77; H04N 25/79; H04N 5/2253
USPC .... 257/431, 448, 294, 774, 777, 31.001, 23, 257/141, 27.13
See application file for complete search history.

(56) References Cited

U.S. PATENT DOCUMENTS

| | | |
|---|---|---|
| 2011/0241178 A1 | 10/2011 | Miki |
| 2012/0217374 A1 | 8/2012 | Nishizawa |
| 2013/0241022 A1 | 9/2013 | Oka |
| 2014/0124889 A1* | 5/2014 | Qian ................. H01L 27/14618 438/455 |
| 2014/0217486 A1* | 8/2014 | Akiyama .......... H01L 27/14627 438/69 |
| 2014/0284670 A1 | 9/2014 | Kawashima |
| 2016/0099275 A1 | 4/2016 | Oka |
| 2018/0166490 A1 | 6/2018 | Wakiyama et al. |

FOREIGN PATENT DOCUMENTS

| | | |
|---|---|---|
| CN | 102651377 A | 8/2012 |
| CN | 103311257 A | 9/2013 |
| CN | 107278328 A | 10/2017 |
| EP | 3268990 A1 | 1/2018 |
| JP | 2011-114261 A | 6/2011 |
| JP | 2011-216753 A | 10/2011 |
| JP | 2012-178496 A | 9/2012 |
| JP | 2013-197113 A | 9/2013 |
| JP | 2016-171297 A | 9/2016 |
| JP | 2017-117968 A | 6/2017 |
| KR | 10-2011-0060809 A | 6/2011 |
| KR | 10-2013-0105336 A | 9/2013 |
| KR | 10-2017-0124538 A | 11/2017 |
| TW | 201125112 A1 | 7/2011 |
| TW | 201338525 A | 9/2013 |
| TW | 201633524 A | 9/2016 |
| WO | 2016/143288 A1 | 9/2016 |

OTHER PUBLICATIONS

International Search Report and Written Opinion of PCT Application No. PCT/JP2019/032182, issued on Nov. 5, 2019, 10 pages of ISRWO.

* cited by examiner

SOLID-STATE IMAGING DEVICE AND ELECTRONIC DEVICE

CROSS REFERENCE TO RELATED APPLICATIONS

This application is a U.S. National Phase of International Patent Application No. PCT/JP2019/032182 filed on Aug. 16, 2019, which claims priority benefit of Japanese Patent Application No. JP 2018-192451 filed in the Japan Patent Office on Oct. 11, 2018. Each of the above-referenced applications is hereby incorporated herein by reference in its entirety.

TECHNICAL FIELD

The present technology relates to a solid-state imaging device and an electronic device.

BACKGROUND ART

In general, solid-state imaging devices such as complementary metal oxide semiconductor (CMOS) image sensors and charge coupled devices (CCDs) are widely used in digital still cameras and digital video cameras.

The solid-state imaging device includes, for example, a pixel unit configured to photoelectrically convert light that has been incident, and a peripheral circuit unit configured to perform signal processing.

For example, there is proposed a solid-state imaging device of a stack type including: a first semiconductor element; and a second semiconductor element that is flip chip mounted on a light incident side of the first semiconductor element (see Patent Document 1). Furthermore, for example, there is proposed an imaging device having a stack of: a first chip having a pixel circuit including a photoelectric conversion element, a drive circuit, an analog circuit, and the like; and a second chip having a control circuit, digital signal processing circuit, and the like (see Patent Document 2).

CITATION LIST

Patent Document

Patent Document 1: Japanese Patent Application Laid-Open No. 2016-171297
Patent Document 2: Japanese Patent Application Laid-Open No. 2017-117968

SUMMARY OF THE INVENTION

Problems to be Solved by the Invention

However, the techniques proposed in Patent Documents 1 and 2 may not be able to further improve the quality.

Therefore, the present technology has been made in view of such a situation, and a main object is to provide a solid-state imaging device capable of further improving quality, and an electronic device installed with the solid-state imaging device.

Solutions to Problems

As a result of diligent research to solve the above-mentioned object, the inventors have succeeded in further improving quality of a solid-state imaging device, and have completed the present technology.

That is, the present technology provides a solid-state imaging device including:
a first semiconductor element having
a first semiconductor layer provided with a first through via and a photoelectric conversion unit configured to photoelectrically convert light that has been incident,
a connection part that is wider than the first through via and is provided outside a region where the photoelectric conversion unit is provided on a surface of the first semiconductor layer on a side for receiving the light,
connection wiring provided on the surface and configured to connect the first through via and the connection part, and
a first passivation layer formed on the surface side;
a second semiconductor element mounted on the first semiconductor element by the connection part; and
a first guard ring formed on an outer peripheral portion of the first semiconductor element to surround the first semiconductor element.

In the solid-state imaging device, at least a part of the first guard ring is arranged outside the first semiconductor layer and above a second semiconductor layer formed in substantially the same layer as the first semiconductor layer, and
the first guard ring is arranged outside the first passivation layer and below a second passivation layer formed in substantially the same layer as the first passivation layer.

In the solid-state imaging device according to the present technology, the first guard ring may be connected to the second semiconductor layer.

In the solid-state imaging device according to the present technology, the first guard ring may be connected to the second passivation layer.

In the solid-state imaging device according to the present technology, the first guard ring may be a metal stack.

In the solid-state imaging device according to the present technology, the first guard ring may include at least one metal layer and a second through via penetrating the second semiconductor layer.

In the solid-state imaging device according to the present technology, the first guard ring may include at least one metal layer, a second through via penetrating the second semiconductor layer, and a via that connects the at least one metal layer and the second through via.

In the solid-state imaging device according to the present technology, the first guard ring may include: a metal layer having a recess; and a metal member extending in a direction substantially perpendicular to the metal layer,
the recess may be connected to the second semiconductor layer, and
the metal layer having the recess may be connected to the metal member.

The solid-state imaging device according to the present technology may further include a second guard ring, and
the second guard ring may be configured by an insulating film and may penetrate the second semiconductor layer, and may be formed on an outer peripheral portion of the first guard ring so as to surround the first guard ring.

The solid-state imaging device according to the present technology may further include a third guard ring, and
the third guard ring may be arranged below the second semiconductor layer, and may be formed on an outer peripheral portion of the first semiconductor element so as to surround the first semiconductor element.

Furthermore, the present technology provides an electronic device installed with a solid-state imaging device.

The solid-state imaging device includes:

a first semiconductor element having
- a first semiconductor layer provided with a first through via and a photoelectric conversion unit configured to photoelectrically convert light that has been incident,
- a connection part that is wider than the first through via and is provided outside a region where the photoelectric conversion unit is provided on a surface of the first semiconductor layer on a side for receiving the light,
- connection wiring provided on the surface and configured to connect the first through via and the connection part, and
- a first passivation layer formed on the surface side;
- a second semiconductor element mounted on the first semiconductor element by the connection part; and
- a first guard ring formed on an outer peripheral portion of the first semiconductor element to surround the first semiconductor element.

In the solid-state imaging device, at least a part of the first guard ring is arranged outside the first semiconductor layer and above a second semiconductor layer formed in substantially the same layer as the first semiconductor layer, and the first guard ring is arranged outside the first passivation layer and below a second passivation layer formed in substantially the same layer as the first passivation layer. Moreover, the present technology provides an electronic device installed with the solid-state imaging device according to the present technology.

Effects of the Invention

According to the present technology, it is possible to further improve reliability of the solid-state imaging device. Note that the effects described herein are not necessarily limited, and any of the effects described in the present disclosure is possible.

MODE FOR CARRYING OUT THE INVENTION

Figures 1A, 1B:
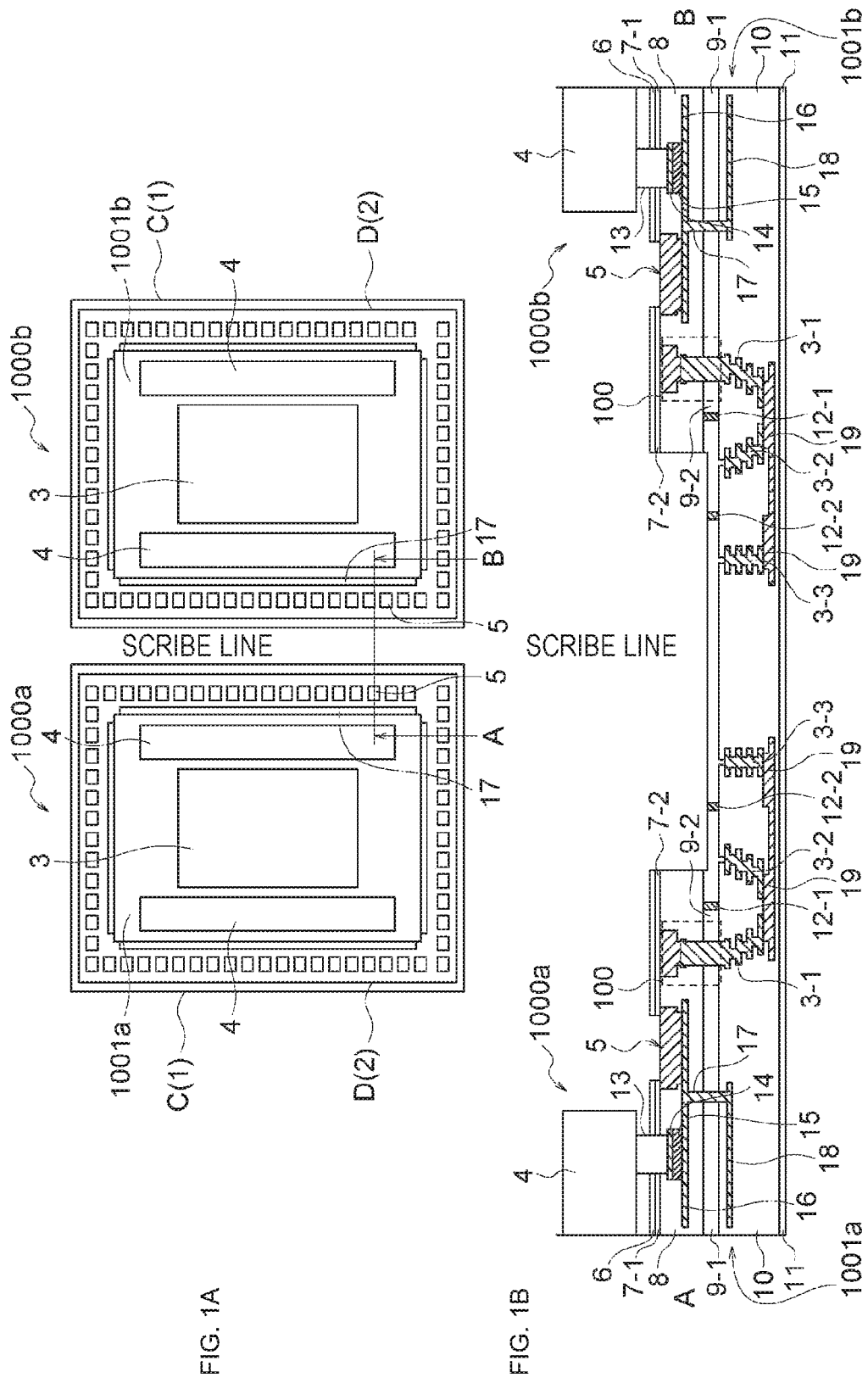
FIGS. 1A and 1B are views showing a configuration example of a solid-state imaging device to which the present technology is applied.

Hereinafter, suitable forms for implementing the present technology will be described. The embodiments described below show one example of a representative embodiment of the present technology, and do not cause the scope of the present technology to be narrowly interpreted. Note that, unless otherwise specified, in the drawings, "upper" means an upper direction or an upper side in the figure, "lower" means a lower direction or a lower side in the figure, "left" means a left direction or a left side in the figure, and "right" means a right direction or a right side in the figure. Furthermore, in the drawings, the same or equivalent elements or members are designated by the same reference numerals, and redundant description will be omitted.

The description will be given in the following order.
1. Outline of present technology
2. First embodiment (Example 1 of solid-state imaging device)
3. Second embodiment (Example 2 of solid-state imaging device)
4. Third embodiment (Example 3 of solid-state imaging device)
5. Fourth embodiment (Example 4 of solid-state imaging device)
6. Fifth embodiment (example of electronic device)
7. Usage example of solid-state imaging device to which present technology is applied 1. Outline of Present Technology First, an outline of the present technology will be described.

In a solid-state imaging device, in a case where a pixel and a peripheral circuit are divided into separate chips and stacked in chip-on-chip, a signal processing chip is flip chip mounted in a region outside a pixel region on a light-receiving surface of a surface irradiation sensor, or, for example, a logic chip is flip chip mounted in a region outside a pixel on a back irradiation pixel chip. However, in the latter case, in order to connect a signal processing element and an imaging element, the imaging element requires a through via and a wiring layer on a light receiving surface side. As described above, as examples of a technique having a light incident surface on a side opposite to an element arrangement surface of a conventional transistor or the like and having both a converging region and a wiring layer, for example, there are a technique characterized by a structure of the converging region and the wiring layer, and a technique characterized in that the wiring layer is not formed together with the converging region but an electrode is formed together with the converging region.

However, such a technique does not have a guard ring for the wiring layer on the light incident surface side, which may cause reliability deterioration such as chipping in dicing work in cutting into chips and wiring corrosion due to inability to block humidity. Furthermore, since a passivation layer to prevent intrusion of moisture is not provided, there is a possibility that reliability deterioration such as wiring corrosion may similarly occur.

Therefore, in the present technology, a guard ring on a light incident surface side (a back surface side) is used. By using, as the guard ring on the light incident surface side (the back surface side), for example, metal formed for light shielding of an optical black detection region, leakage prevention between pixels, or the like, or metal used for wiring formed on the light incident surface side (for example) in order to electrically connect a second semiconductor element (a companion chip) that is flip chip mounted, from a signal circuit surface through a through via, chipping prevention and moisture proofing can be performed. Furthermore, in a case where a pad electrode is formed on the light incident surface side, by connecting the guard ring according to the present technology to metal used for wiring in a height direction to form on an outer peripheral portion of a first semiconductor element, and obtaining a structure in which an uppermost part of the guard ring according to the present technology is in contact with a passivation film, it is possible to more effectively perform chipping prevention and moisture proofing for the wiring layer on the light incident surface side. Note that, it is also possible to use the guard ring on an element surface (a front surface side) of a transistor or the like, and to use a slit-shaped structure that has an insulating film embedded to penetrate silicon (a semiconductor layer), has a function of an alignment mark and insulating and separating a pad electrode, and is used to prevent chipping of a silicon substrate layer (a semiconductor layer). Note that the slit-shaped structure may not be necessary as moisture-proof since silicon itself has low moisture permeability.

The present technology has been made in view of the circumstances described above. A solid-state imaging device according to the present technology includes: a first semiconductor element having a first semiconductor layer provided with a first through via and a photoelectric conversion unit configured to photoelectrically convert light that has been incident, a connection part that is wider than the first through via and is provided outside a region where the photoelectric conversion unit is provided on a surface of the first semiconductor layer on a side for receiving the light, connection wiring provided on the surface and configured to connect the first through via and the connection part, and a first passivation layer formed on the surface side; a second semiconductor element mounted on the first semiconductor element by the connection part; and a first guard ring formed on an outer peripheral portion of the first semiconductor element to surround the first semiconductor element. In the solid-state imaging device, at least a part of the first guard ring is arranged outside the first semiconductor layer and above a second semiconductor layer formed in substantially the same layer as the first semiconductor layer, and the first guard ring is arranged outside the first passivation layer and below a second passivation layer formed in substantially the same layer as the first passivation layer.

According to the present technology, it is possible to further improve quality of the solid-state imaging device. Specifically, according to the present technology, it is possible to further improve reliability of the solid-state imaging device and further improve a manufacturing yield. More specifically, it is possible to ensure quality of wiring on the back surface side, and in particular, it is possible to ensure the quality of the wiring on the back surface side without adding a new process.

Hereinafter, embodiments according to the present technology will be described in detail.

2. First Embodiment (Example 1 of Solid-State Imaging Device)

A solid-state imaging device of a first embodiment (Example 1 of a solid-state imaging device) according to the present technology will be described.

A solid-state imaging device of a first embodiment (Example 1 of a solid-state imaging device) according to the present technology includes: a first semiconductor element having a first semiconductor layer provided with a first through via and a photoelectric conversion unit configured to photoelectrically convert light that has been incident, a connection part that is wider than the first through via and is provided outside a region where the photoelectric conversion unit is provided on a surface of the first semiconductor layer on a side for receiving the light, connection wiring provided on the surface and configured to connect the first through via and the connection part, and a first passivation layer formed on the surface side; a second semiconductor element mounted on the first semiconductor element by the connection part; and a first guard ring formed on an outer peripheral portion of the first semiconductor element to surround the first semiconductor element. In the solid-state imaging device, at least a part of the first guard ring is arranged outside the first semiconductor layer and above a second semiconductor layer formed in substantially the same layer as the first semiconductor layer, and the first guard ring is arranged outside the first passivation layer and below a second passivation layer formed in substantially the same layer as the first passivation layer.

Moreover, the first guard ring provided in the solid-state imaging device of the first embodiment according to the present technology is a metal stack, and includes at least one metal layer, a second through via penetrating the second semiconductor layer, and a via connecting the at least one metal layer and the second through via. Then, the connection part of the first semiconductor element is an electrode for flip chip connection (for example, a land electrode), and includes at least one metal layer and an electrode (a part of wiring on a back surface side (a light incident side)). The solid-state imaging device of the first embodiment according to the present technology is a solid-state imaging device in which the second semiconductor element is flip chip mounted on the first semiconductor element by connecting the connection part of the first semiconductor element and a micro bump of the second semiconductor element.

According to the solid-state imaging device of the first embodiment according to the present technology, it is possible to further improve the quality of the solid-state imaging device. Specifically, according to the present technology, it is possible to further improve reliability of the solid-state imaging device and further improve a manufacturing yield. More specifically, it is possible to ensure quality of wiring on the back surface side, and in particular, it is possible to ensure the quality of the wiring on the back surface side without adding a new process.

Figure 2:
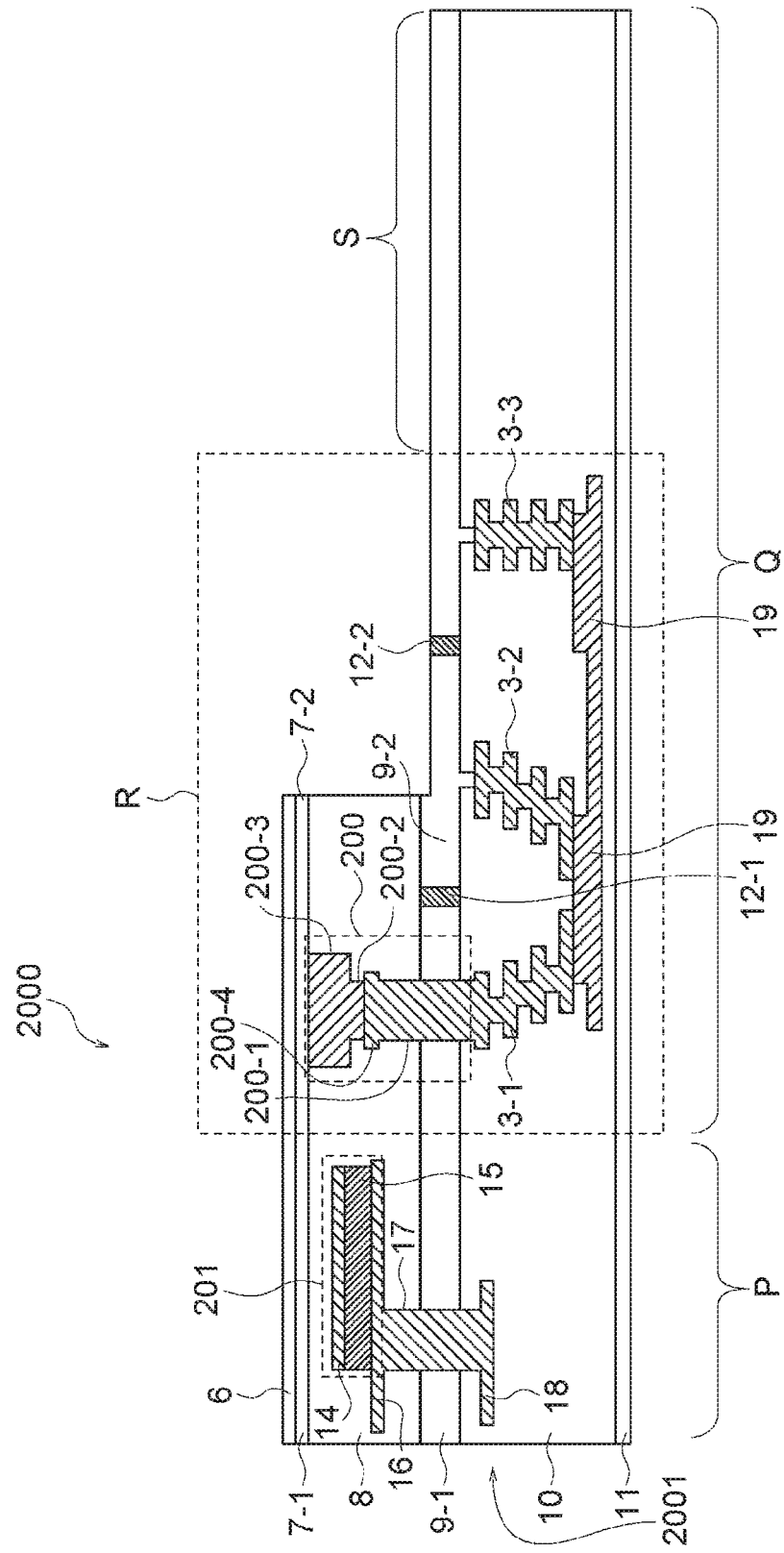
FIG. 2 is a view showing a configuration example of the solid-state imaging device to which the present technology is applied.

Hereinafter, the solid-state imaging device of the first embodiment according to the present technology will be described in more detail with reference to FIGS. 1A, 1B, and 2. FIGS. 1A and 1B are views showing a configuration example of the solid-state imaging device of the first embodiment according to the present technology, in which FIG. 1A is a plan view of a solid-state imaging device 1000*a* and a solid-state imaging device 1000*b* viewed from a light incident side. FIG. 1B is a cross-sectional view of the solid-state imaging device 1000*a* and the solid-state imaging device 1000*b* taken along line A-B shown in FIG. 1A. FIG. 2 is a view showing a configuration example of the solid-state imaging device of the first embodiment according to the present technology, and is a cross-sectional view of a solid-state imaging device 2000.

First, the solid-state imaging device of the first embodiment according to the present technology will be described with reference to FIG. 1A.

The solid-state imaging device 1000*a* is configured by connecting a first semiconductor element (a lower chip, a sensor chip) 1001*a* and two second semiconductor elements (an upper chip, a companion chip) 4 via a micro bump (not shown in FIG. 1A). In the solid-state imaging device 1000*a*, the two second semiconductor elements 4 are flip chip bonded to a light irradiation side (a light receiving surface side) of the first semiconductor chip 1001*a* via the micro bump (not shown in FIG. 1A). The companion chip that is the second semiconductor element 4 may be a logic chip or a memory chip.

A C region shown in FIG. 1A indicates a guard ring part 1. The C region is formed on an outer peripheral portion of the first semiconductor element 1001*a*, in a peripheral portion of the solid-state imaging device 1000*a*. A D region shown in FIG. 1A indicates a peripheral portion 2 of the first semiconductor element 1001*a*, and is formed in an inner peripheral portion of the C region (the guard ring part 1).

In the first semiconductor element 1001*a*, a pixel region 3 or the like is formed. Furthermore, on the first semiconductor chip 1001*a*, a wire-bonding electrode pad 5 is formed. The wire-bonding electrode pad 5 is connected to an external terminal. A plurality of the wire-bonding pad electrodes 5 is formed in an inner peripheral portion of the D region (the peripheral portion 2 of the first semiconductor element 1001*a*) so as to surround the pixel region 3 and the two second semiconductor elements 4.

The solid-state imaging device 1000*b* is configured by connecting a first semiconductor element (a lower chip, a sensor chip) 1001*b* and two second semiconductor elements (an upper chip, a companion chip) 4 via a micro bump (not shown in FIG. 1A). Since a detailed configuration of the solid-state imaging device 1000*b* has a configuration similar to that of the solid-state imaging device 1000*a*, detailed description thereof will be omitted here. Furthermore, between the solid-state imaging device 1000*a* and the solid-state imaging device 1000*b*, that is, between the C region (the guard ring part 1) of the solid-state imaging device 1000*a* and the C region (the guard ring part 1) of the solid-state imaging device 1000*b*, a scribe line region is formed.

Next, a description will be given with reference to FIG. 1B. As described above, in FIG. 1B, an A side in FIG. 1B (a left side in FIG. 1B) shows the solid-state imaging device 1000*a*, a B side of FIG. 1B (a right side in FIG. 1B) shows the solid-state imaging device 1000*b*, and a central portion between the A side in FIG. 1B and the B side in FIG. 1B (a central portion in FIG. 1B) shows a scribe line.

A first guard ring 100 provided in each of the solid-state imaging devices 1000*a* and 1000*b* is formed outside a first passivation layer 7-1 and below a second passivation layer 7-2 (a lower side in FIG. 1B) formed in substantially the same layer as the first passivation layer 7-1. Furthermore, a part of the first guard ring 100 is formed outside a first semiconductor layer 9-1 (on a right side of the solid-state imaging device 1000*a*, on a left side of the solid-state imaging device 1000*b*), and above a second semiconductor layer 9-2 (an upper side in FIG. 1B) formed in substantially the same layer as the first semiconductor layer 9-1. Moreover, a part of the first guard ring 100 is formed so as to penetrate the second semiconductor layer 9-2.

Two second guard rings 12-1 and 12-2 provided to each of the solid-state imaging devices 1000*a* and 1000*b* are configured by an insulating film, and are formed to penetrate inside the second semiconductor layer 9-2.

Three third guard rings 3-1 to 3-3 provided to each of the solid-state imaging devices 1000*a* and 1000*b* are formed below the second semiconductor layer 9-2 (a lower side in FIG. 1B).

The guard ring part 1 shown in FIG. 1A includes the first guard ring 100, the second guard rings 12-1 and 12-2, and the third guard ring 3-1 to 3-3. That is, the first guard ring 100, the second guard rings 12-1 and 12-2, and the third guard rings 3-1 to 3-3 are formed on each outer peripheral portion of the first semiconductor elements 1001*a* and 1001*b*. As shown in FIG. 1B, from the scribe line toward each of the solid-state imaging devices 1000*a* and 1000*b* (in an inward direction of each of the solid-state imaging devices 1000*a* and 1000*b*), the third guard ring 3-3, the second guard ring 12-2, the third guard ring 3-2, the second guard ring 12-1, the first guard ring 100, and the third guard ring 3-1 are formed in this order. The first guard ring 100 and the third guard ring 3-1 are connected substantially in series, and are formed in an innermost peripheral portion of the guard ring part 1.

The solid-state imaging device 1000*a* has a configuration in which the second semiconductor element 4 is flip chip mounted on the first semiconductor element 1001*a* (an upper side in FIG. 1B), by connecting the connection part of the first semiconductor element (a lower chip) 1001*a* and a micro bump 13 of the second semiconductor element 4. Similarly, the solid-state imaging device 1000*b* has a configuration in which the second semiconductor element 4 is flip chip mounted on the first semiconductor element 1001*b* (an upper side in FIG. 1B), by connecting the connection part of the first semiconductor element (a lower chip) 1001*b* and a micro bump 13 of the second semiconductor element 4. The micro bump 13 may be formed by a Sn-based solder such as, for example, SnAg (tin-silver). Note that the flip chip mounting may be mounting by Cu—Cu connection, solder-solder connection, or Cu-solder connection. In a case of a height relationship opposite to a height relationship between the pad electrode 5 shown in FIG. 1B and a metal layer 14 that is an upper part of a flip chip connection electrode, that is, in a case where a height of the flip chip connection electrode (the metal layer 14) is higher than a height of the pad electrode 5, a through via 16, wiring 16 on a back surface side, a metal layer 15, and the metal layer 14 may be connected in this order, and an uppermost part may be made as the first passivation film 7-1.

The connection part of the solid-state imaging devices 1000*a* and 1000*b* is an electrode for flip chip connection (for example, a land electrode), and has a configuration in which the metal layer 15 is formed on a part (an electrode) of the wiring 16 on the back surface side (an upper side of the first semiconductor layer 9-1), and the metal layer 14 is formed on the metal layer 15. Then, the wiring 16 on the back surface side (the upper side of the first semiconductor layer 9-1) is connected to wiring 18 on a front surface side (a lower side of the first semiconductor layer 9-1) via a first through via 17.

The solid-state imaging device of the first embodiment according to the present technology will be described in more detail with reference to FIG. 2.

FIG. 2 shows a chip region P, a scribe region Q, a guard ring region R, and a scribe center region S in the solid-state imaging device 2000. As shown in FIG. 2, the scribe region Q includes the guard ring region R and the scribe center region S.

As shown in FIG. 2, in the chip region P in the solid-state imaging device 2000, a lens material 6, a passivation layer 7-1, a wiring layer 8, a semiconductor layer 9-1, a wiring layer 10, and a passivation layer 11 are arranged in this order from a light incident side (a light receiving surface side, a back surface side). The passivation layer 7-1 may be shared as an inner lens in a pixel region.

As shown in FIG. 2, in the guard ring region R in the solid-state imaging device 2000, a first guard ring 200, second guard rings 12-1 and 12-2, and third guard rings 3-1 to 3-3 are formed.

As shown in FIG. 2, the first guard ring 200 includes a metal layer 200-3, a second through via 200-1 penetrating a second semiconductor layer 9-2, and a via 200-2 connecting the metal layer 200-3 and the second through via 200-1. Note that an electrode (wiring) 200-4 is provided at an upper end of the second through via 200-1, and a direct connection with the via 200-2 is the electrode (wiring) 200-4. Then, the first guard ring 200 is a metal stack in which the metal layer 200-3, the via 200-2, and the second through via 200-1 (the electrode (wiring) 200-4) are stacked in this order from the light incident side (the light receiving surface side, the back surface side).

The first guard ring 200 is formed outside a first passivation layer 7-1 and below a second passivation layer 7-2 (a lower side of FIG. 2) formed in substantially the same layer as the first passivation layer 7-1. In FIG. 2, as illustrated, the first guard ring 200 (the metal layer 200-3) is connected to the second passivation layer 7-2, but the first guard ring 200 may not be connected to the second passivation layer 7-2, and there may be a space of a gap between the first guard ring 200 and the second passivation layer 7-2. Meanwhile, in the solid-state imaging device 2000, as for the passivation layer, the passivation layer formed in the chip region P as described above is referred to as the first passivation layer 7-1, while the passivation layer formed in the guard ring region R is referred to as the second passivation layer 7-2.

As shown in FIG. 2, the metal layer 200-3, the via 200-2, and a part of the second through via 200-1, which are a part of the first guard ring 200, are formed outside the first semiconductor layer 9-1 and above the second semiconductor layer 9-2 (an upper side in FIG. 2) formed in substantially the same layer as the first semiconductor layer 9-1. Moreover, a part of the second through via 200-1, which is a part of the first guard ring 200, is formed so as to penetrate the second semiconductor layer 9-2. Therefore, in FIG. 2, the first guard ring 200 (the second through via 200-1) is connected to the second semiconductor layer 9-2 by the penetration, but the first guard ring 200 may not be connected to the second semiconductor layer 9-2 (for example, a state where the second through via 200-1 is not formed), and there may be a space of a gap between the first guard ring 200 and the second semiconductor layer 9-2. Meanwhile, in the solid-state imaging device 2000, as for the semiconductor layer, the semiconductor layer formed in the chip region P as described above is referred to as the first semiconductor layer 9-1, while the semiconductor layer formed in the guard ring region R is referred to as the second semiconductor layer 9-2.

The metal layer 200-3 and the via 200-2 included in the first guard ring 200 are made from, for example, an alloy of aluminum (Al) and copper (Cu) (which may contain, for example, Al: 90 wt % or more, Cu: less than 10 wt %, Cu: 0 wt %) while the second through via 200-1 (the electrode (wiring) 200-4) is made from, for example, copper (Cu).

As for the second guard rings 12-1 and 12-2 provided in the solid-state imaging device 2000, the second guard rings 12-1 and 12-2 are configured by an insulating film and embedded in the second semiconductor layer 9-2 to be formed in a slit shape. The insulating film is, for example, an inorganic film such as $SiO_2$. The second guard rings 12-1 and 12-2 have a role of a mark for front and back alignment and a function of insulating and separating from silicon (a semiconductor layer), in addition to a chipping prevention effect in dicing work and humidity blocking effect.

The third guard rings 3-1 to 3-3 included in the solid-state imaging device 2000 are formed below the second semiconductor layer 9-2 (a lower side in FIG. 2) and in the wiring layer 10 arranged on the passivation layer 11. The third guard ring 3-1 is connected to the third guard ring 3-2 via a terminal via 19 made from an alloy of aluminum (Al) and copper (Cu) (which may contain, for example, Al: 90 wt % or more, Cu: less than 10 wt %, Cu: 0 wt %). Whereas, the third guard ring 3-2 is connected to the third guard ring 3-3 via a terminal via 19 made from an alloy of aluminum (Al) and copper (Cu) (which may contain, for example, Al: 90 wt % or more, Cu: less than 10 wt %, Cu: 0 wt %). The third guard ring 3-1 is connected to the first guard ring 100, the third guard ring 3-2 is connected to the second semiconductor layer 9-2, and the third guard ring 3-3 is connected to the second semiconductor layer 9-2. The third guard rings 3-1 to 3-3 may be made from, for example, copper (Cu).

An electrode 201 for flip chip connection, which is formed in the chip region P in FIG. 2 and is a connection part, has a configuration in which a metal layer 15 is formed on a part (electrode) of wiring 16 formed in the wiring layer 8 on the back surface side (an upper side of the first semiconductor layer 9-1), and a metal layer 14 is formed on the metal layer 15. Then, the wiring 16 is connected to wiring 18 formed in the wiring layer 10 on a front surface side (a lower side of the first semiconductor layer 9-1) via a first through via 17 penetrating the first semiconductor layer 9-1. The metal layer 15 is made from, for example, cobalt (Co), while the metal layer 14, wiring 17, the first through via 17, and the wiring 18 are made from, for example, copper (Cu).

The solid-state imaging device 2000, including the first guard ring 200, can be manufactured by using a known method (for example, methods described in Japanese Patent Application Laid-Open No. 2016-171297 and Japanese Patent Application Laid-Open No. 2017-117968).

3. Second Embodiment (Example 2 of Solid-State Imaging Device)

A solid-state imaging device of a second embodiment (Example 2 of a solid-state imaging device) according to the present technology will be described.

The solid-state imaging device of the second embodiment (Example 2 of a solid-state imaging device) according to the present technology includes: a first semiconductor element having a first semiconductor layer provided with a first through via and a photoelectric conversion unit configured to photoelectrically convert light that has been incident, a connection part that is wider than the first through via and is provided outside a region where the photoelectric conversion unit is provided on a surface of the first semiconductor layer on a side for receiving the light, connection wiring provided on the surface and configured to connect the first through via and the connection part, and a first passivation layer formed on the surface side; a second semiconductor element mounted on the first semiconductor element by the connection part; and a first guard ring formed on an outer peripheral portion of the first semiconductor element to surround the first semiconductor element. In the solid-state imaging device, at least a part of the first guard ring is arranged outside the first semiconductor layer and above a second semiconductor layer formed in substantially the same layer as the first semiconductor layer, and the first guard ring is arranged outside the first passivation layer and below a second passivation layer formed in substantially the same layer as the first passivation layer.

Moreover, the first guard ring provided in the solid-state imaging device of the second embodiment according to the present technology is a metal stack, and includes at least one metal layer, a second through via penetrating the second semiconductor layer, and a via connecting the at least one metal layer and the second through via. Then, the connection part of the first semiconductor element is an electrode for flip chip connection (for example, a land electrode), and includes at least one metal layer and an electrode (a part of wiring on a back surface side (a light incident side)). The solid-state imaging device of the second embodiment according to the present technology is a solid-state imaging device in which the second semiconductor element is flip chip mounted on the first semiconductor element by connecting the connection part of the first semiconductor element and a micro bump of the second semiconductor element.

According to the solid-state imaging device of the second embodiment according to the present technology, it is possible to further improve the quality of the solid-state imaging device. Specifically, according to the present technology, it is possible to further improve reliability of the solid-state imaging device and further improve a manufacturing yield. More specifically, it is possible to ensure quality of wiring on the back surface side, and in particular, it is possible to ensure the quality of the wiring on the back surface side without adding a new process.

Figure 3:
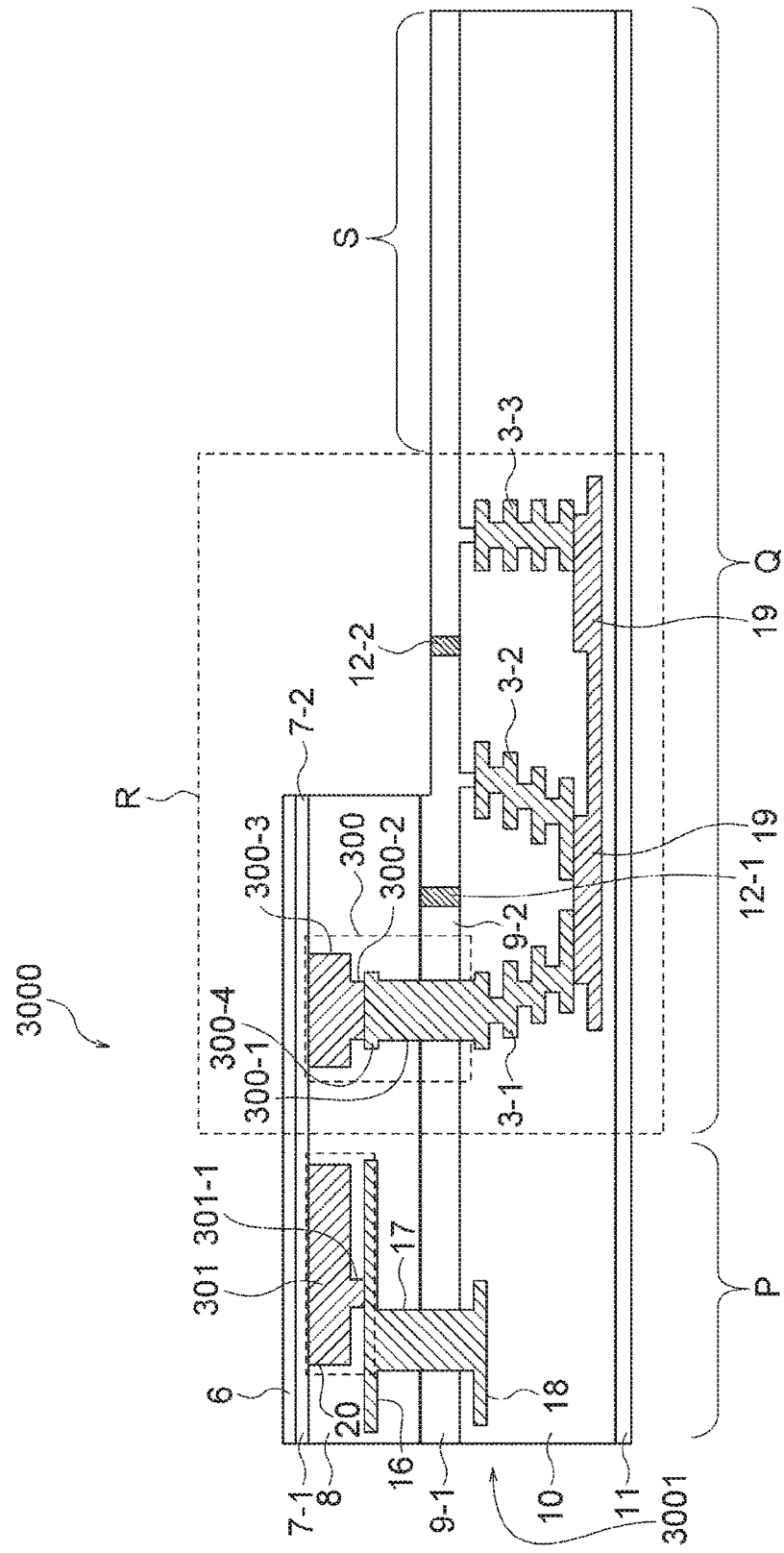
FIG. 3 is a view showing a configuration example of the solid-state imaging device to which the present technology is applied.

Hereinafter, the solid-state imaging device of the second embodiment according to the present technology will be described in more detail with reference to FIG. 3. FIG. 3 is a view showing a configuration example of the solid-state imaging device of the second embodiment according to the present technology, and is a cross-sectional view of a solid-state imaging device 3000.

FIG. 3 shows a chip region P, a scribe region Q, a guard ring region R, and a scribe center region S in the solid-state imaging device 3000. The scribe region Q includes the guard ring region R and the scribe center region S.

As shown in FIG. 3, in the chip region P in the solid-state imaging device 3000, a lens material 6, a passivation layer 7-1, a wiring layer 8, a semiconductor layer 9-1, a wiring layer 10, and a passivation layer 11 are arranged in this order from a light incident side (a light receiving surface side, a back surface side). The passivation layer 7-1 may be shared as an inner lens in a pixel region.

As shown in FIG. 3, in the guard ring region R in the solid-state imaging device 3000, a first guard ring 300, second guard rings 12-1 and 12-2, and third guard rings 3-1 to 3-3 are formed.

As shown in FIG. 3, the first guard ring 300 includes a metal layer 300-3, a second through via 300-1 penetrating a second semiconductor layer 9-2, and a via 300-2 connecting the metal layer 300-3 and the second through via 300-1. Note that an electrode (wiring) 300-4 is provided at an upper end of the second through via 300-1, and a direct connection with the via 300-2 is the electrode (wiring) 300-4. Then, the first guard ring 300 is a metal stack in which the metal layer 300-3, the via 300-2, and the second through via 300-1 (the electrode (wiring) 300-4) are stacked in this order from the light incident side (the light receiving surface side, the back surface side).

The first guard ring 300 is formed outside the first passivation layer 7-1 and below a second passivation layer 7-2 (a lower side of FIG. 3) formed in substantially the same layer as the first passivation layer 7-1. In FIG. 3, as illustrated, the first guard ring 300 (the metal layer 300-3) is connected to the second passivation layer 7-2, but the first guard ring 300 may not be connected to the second passivation layer 7-2, and there may be a space of a gap between the first guard ring 300 and the second passivation layer 7-2.

Meanwhile, in the solid-state imaging device 3000, as for the passivation layer, the passivation layer formed in the chip region P as described above is referred to as the first passivation layer 7-1, while the passivation layer formed in the guard ring region R is referred to as the second passivation layer 7-2.

As shown in FIG. 3, the metal layer 300-3, the via 300-2, and a part of the second through via 300-1, which are a part of the first guard ring 300, are formed outside the first semiconductor layer 9-1 and above the second semiconductor layer 9-2 (an upper side in FIG. 3) formed in substantially the same layer as the first semiconductor layer 9-1. Moreover, a part of the second through via 300-1, which is a part of the first guard ring 300, is formed so as to penetrate the second semiconductor layer 9-2. Therefore, in FIG. 3, the first guard ring 300 (the second through via 300-1) is connected to the second semiconductor layer 9-2 by the penetration, but the first guard ring 300 may not be connected to the second semiconductor layer 9-2 (for example, a state where the second through via 300-1 is not formed), and there may be a space of a gap between the first guard ring 300 and the second semiconductor layer 9-2. Meanwhile, in the solid-state imaging device 3000, as for the semiconductor layer, the semiconductor layer formed in the chip region P as described above is referred to as the first semiconductor layer 9-1, while the semiconductor layer formed in the guard ring region R is referred to as the second semiconductor layer 9-2.

The metal layer 300-3 and the via 300-2 included in the first guard ring 300 are made from, for example, an alloy of aluminum (Al) and copper (Cu) (which may contain, for example, Al: 90 wt % or more, Cu: less than 10 wt %, Cu: 0 wt %) while the second through via 300-1 (the electrode (wiring) 300-4) is made from, for example, copper (Cu).

As for the second guard rings 12-1 and 12-2 provided in the solid-state imaging device 3000, the second guard rings 12-1 and 12-2 are configured by an insulating film and embedded in the second semiconductor layer 9-2 to be formed in a slit shape. The insulating film is, for example, an inorganic film such as $SiO_2$. The second guard rings 12-1 and 12-2 have a role of a mark for front and back alignment and a function of insulating and separating from silicon (a semiconductor layer), in addition to a chipping prevention effect in dicing work and humidity blocking effect.

The third guard rings 3-1 to 3-3 included in the solid-state imaging device 3000 are formed below the second semiconductor layer 9-2 (a lower side in FIG. 3) and in the wiring layer 10 arranged on the passivation layer 11. The third guard ring 3-1 is connected to the third guard ring 3-2 via a terminal via 19 made from an alloy of aluminum (Al) and copper (Cu) (which may contain, for example, Al: 90 wt % or more, Cu: less than 10 wt %, Cu: 0 wt %). Whereas, the third guard ring 3-2 is connected to the third guard ring 3-3 via a terminal via 19 made from an alloy of aluminum (Al) and copper (Cu) (which may contain, for example, Al: 90 wt % or more, Cu: less than 10 wt %, Cu: 0 wt %). The third guard ring 3-1 is connected to the first guard ring 100, the third guard ring 3-2 is connected to the second semiconductor layer 9-2, and the third guard ring 3-3 is connected to the second semiconductor layer 9-2. The third guard rings 3-1 to 3-3 may be made from, for example, copper (Cu).

An electrode 301 for flip chip connection, which is formed in the chip region P in FIG. 3 and is a connection part, has a configuration in which a metal layer 301 is formed on a part (electrode) of wiring 16 formed in the wiring layer 8 on the back surface side (an upper side of the first semiconductor layer 9-1) via a connecting member

301-1. Then, the wiring 16 is connected to wiring 18 formed in the wiring layer 10 on a front surface side (a lower side of the first semiconductor layer 9-1) via a first through via 17 penetrating the first semiconductor layer 9-1. The metal layer 301 and the connecting member 301-1 are made from, for example, an alloy of aluminum (Al) and copper (Cu) (which may contain, for example, Al: 90 wt % or more, Cu: less than 10 wt %, Cu: 0 wt %), while the metal layer 14, the wiring 17, the first through via 17, and the wiring 18 are made from, for example, copper (Cu).

As described above, since the configuration of the first guard ring 300 is the same as the configuration including an electrode 401 for flip chip connection and the first through via 17, it is possible to manufacture the first guard ring 300 without adding a process. Except for a manufacturing method of the first guard ring 300, the solid-state imaging device 3000 can be manufactured by using a known method (for example, methods described in Japanese Patent Application Laid-Open No. 2016-171297 and Japanese Patent Application Laid-Open No. 2017-117968).

For the solid-state imaging device of the second embodiment according to the present technology, in addition to the contents described above, the contents described in the section of the solid-state imaging device of the first embodiment according to the present technology can be applied as they are, unless there is a technical contradiction.

4. Third Embodiment (Example 3 of Solid-State Imaging Device)

A solid-state imaging device of a third embodiment (Example 3 of a solid-state imaging device) according to the present technology will be described.

The solid-state imaging device of the third embodiment (Example 3 of a solid-state imaging device) according to the present technology includes: a first semiconductor element having a first semiconductor layer provided with a first through via and a photoelectric conversion unit configured to photoelectrically convert light that has been incident, a connection part that is wider than the first through via and is provided outside a region where the photoelectric conversion unit is provided on a surface of the first semiconductor layer on a side for receiving the light, connection wiring provided on the surface and configured to connect the first through via and the connection part, and a first passivation layer formed on the surface side; a second semiconductor element mounted on the first semiconductor element by the connection part; and a first guard ring formed on an outer peripheral portion of the first semiconductor element to surround the first semiconductor element. In the solid-state imaging device, at least a part of the first guard ring is arranged outside the first semiconductor layer and above a second semiconductor layer formed in substantially the same layer as the first semiconductor layer, and the first guard ring is arranged outside the first passivation layer and below a second passivation layer formed in substantially the same layer as the first passivation layer.

Moreover, the first guard ring provided in the solid-state imaging device of the third embodiment according to the present technology is a metal stack, and includes at least one metal layer and a second through via penetrating the second semiconductor layer. Then, the connection part of the first semiconductor element is an electrode for flip chip connection (for example, a land electrode), and includes at least one metal layer and an electrode (a part of wiring on a back surface side (a light incident side)). The solid-state imaging device of the third embodiment according to the present technology is a solid-state imaging device in which the second semiconductor element is flip chip mounted on the first semiconductor element by connecting the connection part of the first semiconductor element and a micro bump of the second semiconductor element.

According to the solid-state imaging device of the third embodiment according to the present technology, it is possible to further improve the quality of the solid-state imaging device. Specifically, according to the present technology, it is possible to further improve reliability of the solid-state imaging device and further improve a manufacturing yield. More specifically, it is possible to ensure quality of wiring on the back surface side, and in particular, it is possible to ensure the quality of the wiring on the back surface side without adding a new process.

Figure 4:
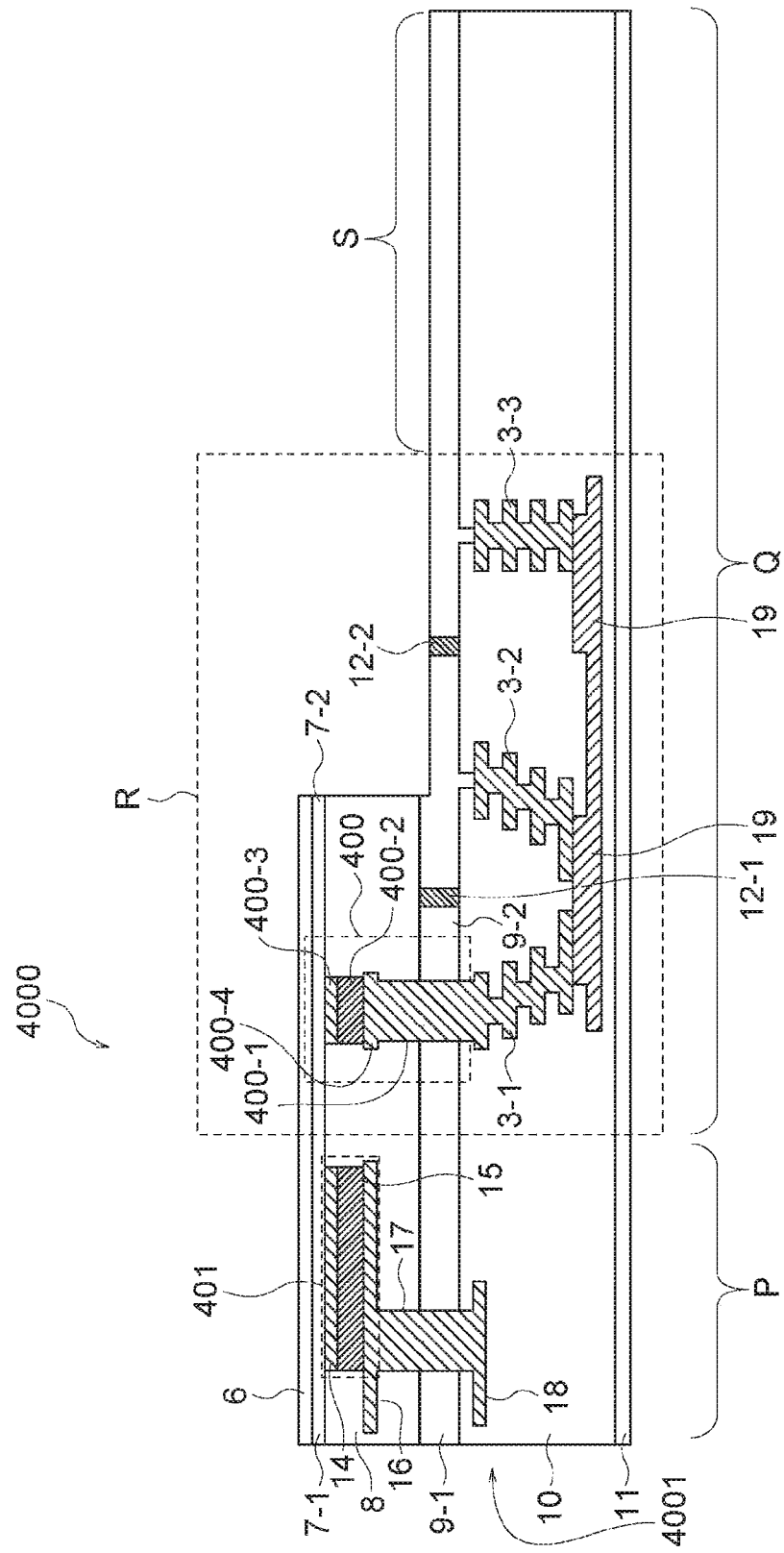
FIG. 4 is a view showing a configuration example of the solid-state imaging device to which the present technology is applied.

Hereinafter, the solid-state imaging device of the third embodiment according to the present technology will be described in more detail with reference to FIG. 4. FIG. 4 is a view showing a configuration example of the solid-state imaging device of the third embodiment according to the present technology, and is a cross-sectional view of a solid-state imaging device 4000.

FIG. 4 shows a chip region P, a scribe region Q, a guard ring region R, and a scribe center region S in the solid-state imaging device 4000. The scribe region Q includes the guard ring region R and the scribe center region S.

As shown in FIG. 4, in the chip region P in the solid-state imaging device 4000, a lens material 6, a passivation layer 7-1, a wiring layer 8, a semiconductor layer 9-1, a wiring layer 10, and a passivation layer 11 are arranged in this order from a light incident side (a light receiving surface side, a back surface side). The passivation layer 7-1 may be shared as an inner lens in a pixel region.

As shown in FIG. 4, in the guard ring region R in the solid-state imaging device 4000, a first guard ring 400, second guard rings 12-1 and 12-2, and third guard rings 3-1 to 3-3 are formed.

As shown in FIG. 4, the first guard ring 400 includes a metal layer 400-3, a metal layer 400-2, and a second through via 400-1 penetrating a second semiconductor layer 9-2. Note that an electrode (wiring) 400-4 is provided at an upper end of the second through via 400-1, and a direct connection with the metal layer 400-2 is the electrode (wiring) 400-4. Then, the first guard ring 400 is a metal stack in which the metal layer 400-3, the metal layer 400-2, and the second through via 400-1 (the electrode (wiring) 400-4) are stacked in this order from the light incident side (the light receiving surface side, the back surface side).

The first guard ring 400 is formed outside the first passivation layer 7-1 and below a second passivation layer 7-2 (a lower side of FIG. 4) formed in substantially the same layer as the first passivation layer 7-1. In FIG. 4, as illustrated, the first guard ring 400 (the metal layer 400-3) is connected to the second passivation layer 7-2, but the first guard ring 400 may not be connected to the second passivation layer 7-2, and there may be a space of a gap between the first guard ring 400 and the second passivation layer 7-2. Meanwhile, in the solid-state imaging device 4000, as for the passivation layer, the passivation layer formed in the chip region P is referred to as the first passivation layer 7-1, while the passivation layer formed in the guard ring region R is referred to as the second passivation layer 7-2.

As shown in FIG. 4, the metal layer 400-3, the metal layer 400-2, and a part of the second through via 400-1, which are a part of the first guard ring 400, are formed outside the first semiconductor layer 9-1 and above the second semiconductor layer 9-2 (an upper side in FIG. 4) formed in substantially the same layer as the first semiconductor layer 9-1. Moreover, a part of the second through via 400-1, which is a part of the first guard ring 400, is formed so as to penetrate the second semiconductor layer 9-2. Therefore, in FIG. 4, the first guard ring 400 (the second through via 400-1) is connected to the second semiconductor layer 9-2 by the penetration, but the first guard ring 400 may not be connected to the second semiconductor layer 9-2 (for example, a state where the second through via 400-1 is not formed), and there may be a space of a gap between the first guard ring 400 and the second semiconductor layer 9-2. Meanwhile, in the solid-state imaging device 4000, as for the semiconductor layer, the semiconductor layer formed in the chip region P is referred to as the first semiconductor layer 9-1, while the semiconductor layer formed in the guard ring region R is referred to as the second semiconductor layer 9-2.

The metal layer 400-3 included in the first guard ring 400 is made from, for example, copper (Cu), the metal layer 400-2 is made from, for example, cobalt (Co), and the second through via 400-1 (the electrode (wiring) 300-4) is made from, for example, copper (Cu).

As for the second guard rings 12-1 and 12-2 provided in the solid-state imaging device 4000, the second guard rings 12-1 and 12-2 are configured by an insulating film and embedded in the second semiconductor layer 9-2 to be formed in a slit shape. The insulating film is, for example, an inorganic film such as $SiO_2$. The second guard rings 12-1 and 12-2 have a role of a mark for front and back alignment and a function of insulating and separating from silicon (a semiconductor layer), in addition to a chipping prevention effect in dicing work and humidity blocking effect.

The third guard rings 3-1 to 3-3 included in the solid-state imaging device 4000 are formed below the second semiconductor layer 9-2 (a lower side in FIG. 4) and in the wiring layer 10 arranged on the passivation layer 11. The third guard ring 3-1 is connected to the third guard ring 3-2 via a terminal via 19 made from an alloy of aluminum (Al) and copper (Cu) (which may contain, for example, Al: 90 wt % or more, Cu: less than 10 wt %, Cu: 0 wt %). Whereas, the third guard ring 3-2 is connected to the third guard ring 3-3 via a terminal via 19 made from an alloy of aluminum (Al) and copper (Cu) (which may contain, for example, Al: 90 wt % or more, Cu: less than 10 wt %, Cu: 0 wt %). The third guard ring 3-1 is connected to the first guard ring 100, the third guard ring 3-2 is connected to the second semiconductor layer 9-2, and the third guard ring 3-3 is connected to the second semiconductor layer 9-2. The third guard rings 3-1 to 3-3 may be made from, for example, copper (Cu).

An electrode 401 for flip chip connection, which is formed in the chip region P in FIG. 4 and is a connection part, has a configuration in which a metal layer 15 is formed on a part (electrode) of wiring 16 formed in the wiring layer 8 on the back surface side (an upper side of the first semiconductor layer 9-1), and a metal layer 14 is formed on the metal layer 15. Then, the wiring 16 is connected to wiring 18 formed in the wiring layer 10 on a front surface side (a lower side of the first semiconductor layer 9-1) via a first through via 17 penetrating the first semiconductor layer 9-1. The metal layer 15 is made from, for example, cobalt (Co), while the metal layer 14, wiring 17, the first through via 17, and the wiring 18 are made from, for example, copper (Cu).

As described above, since the configuration of the first guard ring 400 is the same as the configuration including the electrode 401 for flip chip connection and the first through via 17, it is possible to manufacture the first guard ring 400 without adding a process. Except for a manufacturing method of the first guard ring 400, the solid-state imaging device 4000 can be manufactured by using a known method (for example, methods described in Japanese Patent Application Laid-Open No. 2016-171297 and Japanese Patent Application Laid-Open No. 2017-117968).

For the solid-state imaging device of the third embodiment according to the present technology, in addition to the contents described above, the contents described in the section of the solid-state imaging device of the first embodiment according to the present technology can be applied as they are, unless there is a technical contradiction.

5. Fourth Embodiment (Example 4 of Solid-State Imaging Device)

A solid-state imaging device of a fourth embodiment (Example 4 of a solid-state imaging device) according to the present technology will be described.

The solid-state imaging device of the fourth embodiment (Example 4 of a solid-state imaging device) according to the present technology includes: a first semiconductor element having a first semiconductor layer provided with a first through via and a photoelectric conversion unit configured to photoelectrically convert light that has been incident, a connection part that is wider than the first through via and is provided outside a region where the photoelectric conversion unit is provided on a surface of the first semiconductor layer on a side for receiving the light, connection wiring provided on the surface and configured to connect the first through via and the connection part, and a first passivation layer formed on the surface side; a second semiconductor element mounted on the first semiconductor element by the connection part; and a first guard ring formed on an outer peripheral portion of the first semiconductor element to surround the first semiconductor element. In the solid-state imaging device, at least a part of the first guard ring is arranged outside the first semiconductor layer and above a second semiconductor layer formed in substantially the same layer as the first semiconductor layer, and the first guard ring is arranged outside the first passivation layer and below a second passivation layer formed in substantially the same layer as the first passivation layer.

Moreover, the first guard ring provided in the solid-state imaging device of the fourth embodiment according to the present technology is a metal stack, and includes a metal layer having a recess, and a metal member extending in a direction substantially perpendicular to the metal layer. The recess is connected to the second semiconductor layer, and the metal layer having the recess is connected to the metal member. Then, the connection part of the first semiconductor element is an electrode for flip chip connection (for example, a land electrode), and includes at least one metal layer and an electrode (a part of wiring on a back surface side (a light incident side)). The solid-state imaging device of the fourth embodiment according to the present technology is a solid-state imaging device in which the second semiconductor element is flip chip mounted on the first semiconductor element by connecting the connection part of the first semiconductor element and a micro bump of the second semiconductor element.

According to the solid-state imaging device of the fourth embodiment according to the present technology, it is possible to further improve the quality of the solid-state imaging device. Specifically, according to the present technology, it is possible to further improve reliability of the solid-state imaging device and further improve a manufacturing yield. More specifically, it is possible to ensure quality of wiring on the back surface side, and in particular, it is possible to ensure the quality of the wiring on the back surface side without adding a new process.

Figure 5:
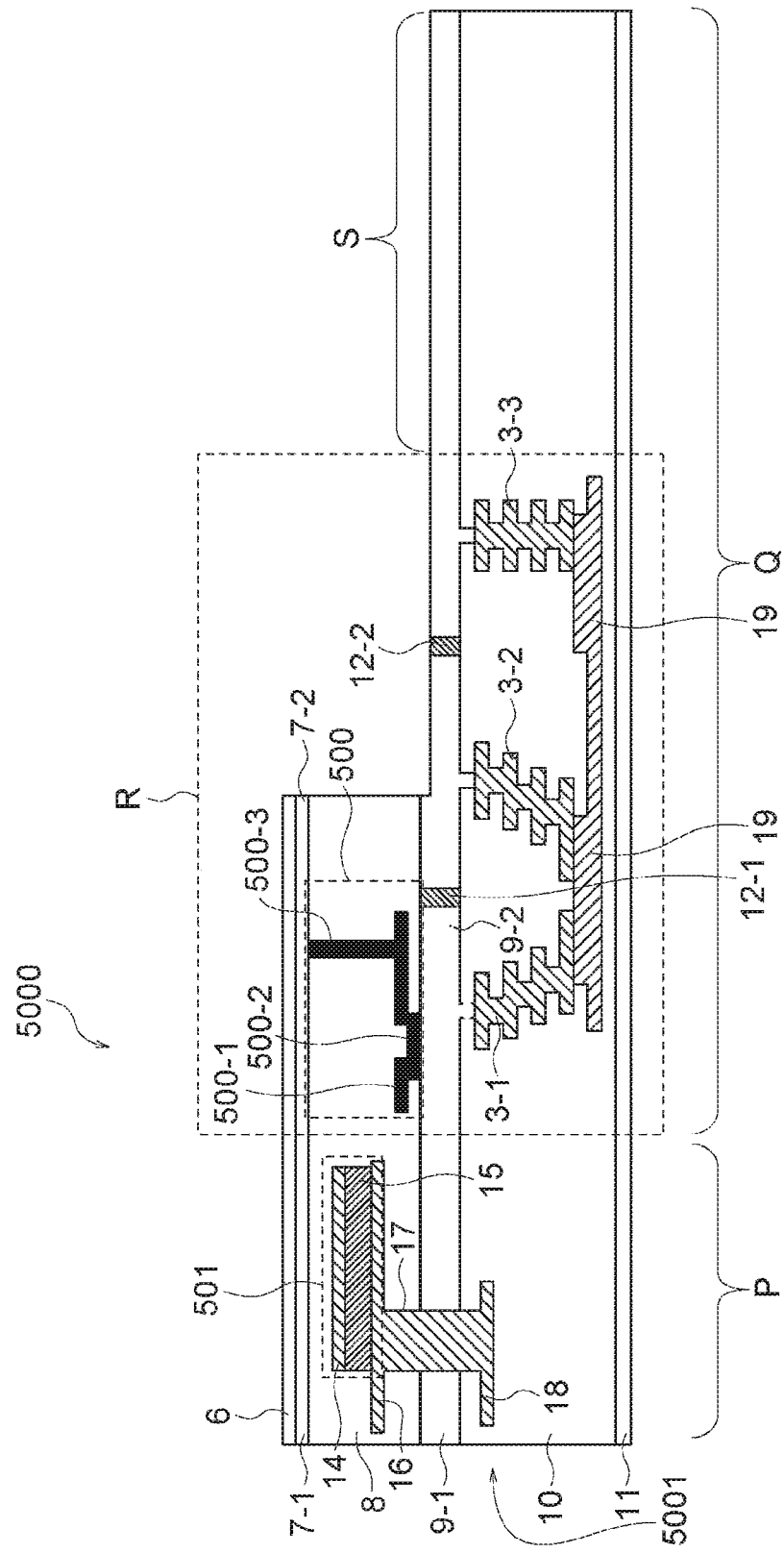
FIG. 5 is a view showing a configuration example of the solid-state imaging device to which the present technology is applied.

Hereinafter, the solid-state imaging device of the fourth embodiment according to the present technology will be described in more detail with reference to FIG. 5. FIG. 5 is a view showing a configuration example of the solid-state imaging device of the fourth embodiment according to the present technology, and is a cross-sectional view of a solid-state imaging device 5000.

FIG. 5 shows a chip region P, a scribe region Q, a guard ring region R, and a scribe center region S in the solid-state imaging device 5000. The scribe region Q includes the guard ring region R and the scribe center region S.

As shown in FIG. 5, in the chip region P in the solid-state imaging device 5000, a lens material 6, a passivation layer 7-1, a wiring layer 8, a semiconductor layer 9-1, a wiring layer 10, and a passivation layer 11 are arranged in this order from a light incident side (a light receiving surface side, a back surface side). The passivation layer 7-1 may be shared as an inner lens in a pixel region.

As shown in FIG. 5, in the guard ring region R in the solid-state imaging device 5000, a first guard ring 500, second guard rings 12-1 and 12-2, and third guard rings 3-1 to 3-3 are formed.

As shown in FIG. 5, the first guard ring 500 includes a metal layer 500-1 having a recess 500-2, and a metal member 500-3 extending substantially perpendicular to the metal layer 500-1 and connected to the metal layer 500-1. Then, the first guard ring 400 is a metal stack in which the metal layer 400-3, the metal layer 400-2, and the second through via 400-1 (the electrode (wiring) 400-4) are stacked in this order from the light incident side (the light receiving surface side, the back surface side).

The first guard ring 450 is formed outside the first passivation layer 7-1 and below a second passivation layer 7-2 (a lower side of FIG. 4) formed in substantially the same layer as the first passivation layer 7-1. In FIG. 5, as illustrated, the first guard ring 500 (the metal member 500-3) is connected to the second passivation layer 7-2, but the first guard ring 500 may not be connected to the second passivation layer 7-2, and there may be a space of a gap between the first guard ring 500 and the second passivation layer 7-2. Meanwhile, in the solid-state imaging device 5000, as for the passivation layer, the passivation layer formed in the chip region P as described above is referred to as the first passivation layer 7-1, while the passivation layer formed in the guard ring region R is referred to as the second passivation layer 7-2.

As shown in FIG. 5, the metal layer 500-1 having the recess 500-2 and the metal member 500-3 included in the first guard ring are formed outside the first semiconductor layer 9-1 and above a second semiconductor layer 9-2 (an upper side in FIG. 4) formed in substantially the same layer as the first semiconductor layer 9-1. Moreover, the recess 500-2 is connected to the second semiconductor layer 9-2. Therefore, in FIG. 5, the first guard ring 500 (the metal member 500-3) is connected to the second semiconductor layer 9-2, but the first guard ring 500 may not be connected to the second semiconductor layer 9-2 (for example, a state where a second through via 500-1 is not formed), and there may be a space of a gap between the first guard ring 500 and the second semiconductor layer 9-2. Meanwhile, in the solid-state imaging device 4000, the semiconductor layer formed in the chip region P as described above is referred to as the first semiconductor layer 9-1, while the semiconductor layer formed in the guard ring region R is referred to as the second semiconductor layer 9-2.

The first guard ring 500 is made from, for example, tungsten (W).

As for the second guard rings 12-1 and 12-2 provided in the solid-state imaging device 5000, the second guard rings 12-1 and 12-2 are configured by an insulating film and embedded in the second semiconductor layer 9-2 to be formed in a slit shape. The insulating film is, for example, an inorganic film such as $SiO_2$. The second guard rings 12-1 and 12-2 have a role of a mark for front and back alignment and a function of insulating and separating from silicon (a semiconductor layer), in addition to a chipping prevention effect in dicing work and humidity blocking effect.

The third guard rings 3-1 to 3-3 included in the solid-state imaging device 5000 are formed below the second semiconductor layer 9-2 (a lower side in FIG. 5) and in the wiring layer 10 arranged on the passivation layer 11. The third guard ring 3-1 is connected to the third guard ring 3-2 via a terminal via 19 made from an alloy of aluminum (Al) and copper (Cu) (which may contain, for example, Al: 90 wt % or more, Cu: less than 10 wt %, Cu: 0 wt %). Whereas, the third guard ring 3-2 is connected to the third guard ring 3-3 via a terminal via 19 made from an alloy of aluminum (Al) and copper (Cu) (which may contain, for example, Al: 90 wt % or more, Cu: less than 10 wt %, Cu: 0 wt %). The third guard ring 3-1 is connected to the first guard ring 100, the third guard ring 3-2 is connected to the second semiconductor layer 9-2, and the third guard ring 3-3 is connected to the second semiconductor layer 9-2. The third guard rings 3-1 to 3-3 may be made from, for example, copper (Cu).

An electrode 501 for flip chip connection, which is formed in the chip region P in FIG. 5 and is a connection part, has a configuration in which a metal layer 15 is formed on a part (electrode) of wiring 16 formed in the wiring layer 8 on the back surface side (an upper side of the first semiconductor layer 9-1), and a metal layer 14 is formed on the metal layer 15. Then, the wiring 16 is connected to wiring 18 formed in the wiring layer 10 on a front surface side (a lower side of the first semiconductor layer 9-1) via a first through via 17 penetrating the first semiconductor layer 9-1. The metal layer 15 is made from, for example, cobalt (Co), while the metal layer 14, wiring 17, the first through via 17, and the wiring 18 are made from, for example, copper (Cu).

The metal layer 500-1 is the same as metal formed for light shielding of an optical black region grounded on a semiconductor layer (a silicon substrate), and the metal member 500-3 is the same as light-shielding metal formed for blocking leaked light between pixels and formed to connect at an outer peripheral portion of a chip. Therefore, it is possible to manufacture the first guard ring 500 without an additional process. Except for a manufacturing method of the first guard ring 500, the solid-state imaging device 5000 can be manufactured by using a known method (for example, methods described in Japanese Patent Application Laid-Open No. 2016-171297 and Japanese Patent Application Laid-Open No. 2017-117968).

For the solid-state imaging device of the fourth embodiment according to the present technology, in addition to the contents described above, the contents described in the section of the solid-state imaging device of the first embodiment according to the present technology can be applied as they are, unless there is a technical contradiction.

6. Fifth Embodiment (Example of Electronic Device)

An electronic device of a fifth embodiment according to the present technology is an electronic device installed with a solid-state imaging device according to the present technology. The solid-state imaging device according to the present technology includes: a first semiconductor element having a first semiconductor layer provided with a first through via and a photoelectric conversion unit configured to photoelectrically convert light that has been incident, a connection part that is wider than the first through via and is provided outside a region where the photoelectric conversion unit is provided on a surface of the first semiconductor layer on a side for receiving the light, connection wiring provided on the surface and configured to connect the first through via and the connection part, and a first passivation layer formed on the surface side; a second semiconductor element mounted on the first semiconductor element by the connection part; and a first guard ring formed on an outer peripheral portion of the first semiconductor element to surround the first semiconductor element. In the solid-state imaging device, the first guard ring is arranged outside the first semiconductor layer and above a second semiconductor layer formed in substantially the same layer as the first semiconductor layer, and is connected to the second semiconductor layer, and the first guard ring is arranged outside the first passivation layer and below a second passivation layer formed in substantially the same layer as the first passivation layer.

For example, the electronic device of the fifth embodiment according to the present technology is an electronic device installed with the solid-state imaging device of any one embodiment, among the solid-state imaging devices of the first to fourth embodiments according to the present technology.

Figure 6:
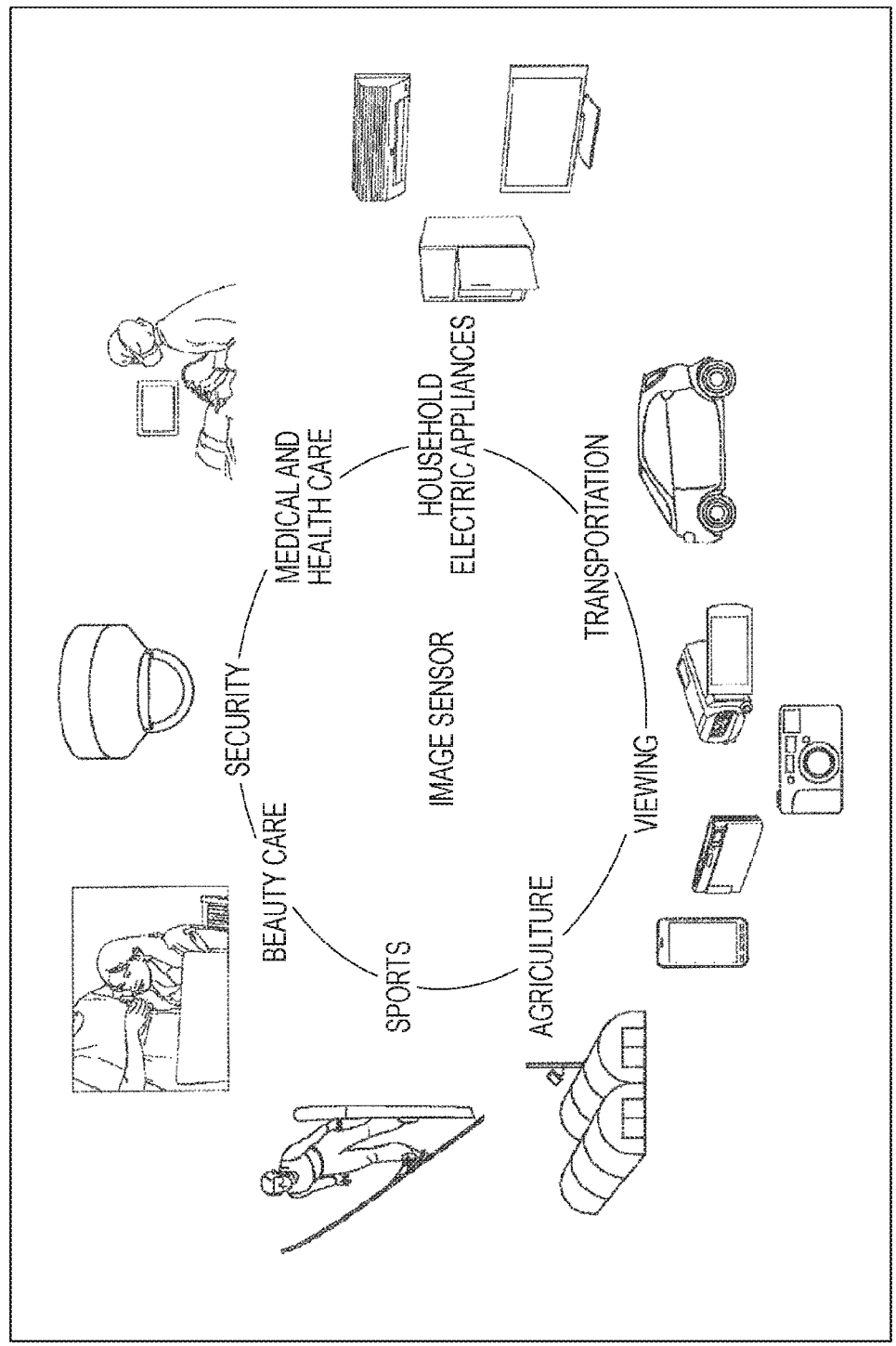
FIG. 6 is a view showing a usage example of a solid-state imaging device of first to fourth embodiments to which the present technology is applied.

7. Usage Example of Solid-State Imaging Device to which Present Technology is Applied FIG. 6 is a view showing a usage example of the solid-state imaging device of the first to fourth embodiments according to the present technology, as an image sensor.

The solid-state imaging device of the first to fourth embodiments described above can be used in various cases for sensing light such as visible light, infrared light, ultraviolet light, and X-ray, for example, as described below. That is, as shown in FIG. 6, the solid-state imaging device of any one embodiment among the first to fourth embodiments can be used for devices (for example, the electronic device of the fifth embodiment described above) used in, for example, a field of viewing where images for viewing are captured, a field of transportation, a field of household electric appliances, a field of medical and healthcare, a field of security, a field of beauty care, a field of sports, a field of agriculture, and the like.

Specifically, in the field of viewing, the solid-state imaging device of any one embodiment among the first to fourth embodiments can be used for a device to capture an image to be used for viewing, for example, such as a digital camera, a smartphone, or a mobile phone with a camera function.

In the field of transportation, for example, for safe driving such as automatic stop, recognition of a driver's condition, and the like, the solid-state imaging device of any one embodiment among the first to fourth embodiments can be used for devices used for transportation, such as in-vehicle sensors that capture an image in front, rear, surroundings, interior, and the like of an automobile, monitoring cameras that monitor traveling vehicles and roads, and distance measurement sensors that measure a distance between vehicles.

In the field of household electric appliances, for example, in order to capture an image of a user's gesture and operate a device in accordance with the gesture, the solid-state imaging device of any one embodiment among the first to fourth embodiments can be used for devices used in household electric appliances, such as TV receivers, refrigerators, and air conditioners.

In the field of medical and healthcare, for example, the solid-state imaging device of any one embodiment among the first to fourth embodiments can be used for devices used for medical and healthcare, such as endoscopes and devices that perform angiography by receiving infrared light.

In the field of security, for example, the solid-state imaging element of any one embodiment among the first to fourth embodiments can be used for devices used for security, such as monitoring cameras for crime prevention and cameras for personal authentication.

In the field of beauty care, for example, the solid-state imaging device of any one embodiment among the first to fourth embodiments can be used for devices used for beauty care, such as skin measuring instruments for image capturing of skin, and microscopes for image capturing of a scalp.

In the field of sports, for example, the solid-state imaging device of any one embodiment among the first to fourth embodiments can be used for devices used for sports, such as action cameras and wearable cameras for sports applications and the like.

In the field of agriculture, for example, the solid-state imaging device of any one embodiment among the first to fourth embodiments can be used for devices used for agriculture, such as cameras for monitoring conditions of fields and crops.

Figure 7:
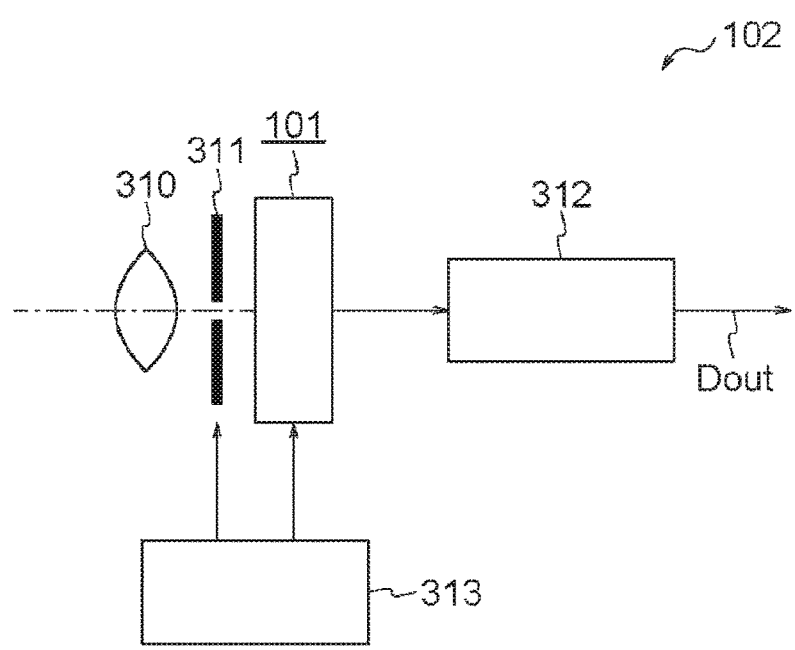
FIG. 7 is a functional block diagram of an example of an electronic device according to a fifth embodiment to which the present technology is applied.

Next, a usage example of the solid-state imaging device of the first to fourth embodiments according to the present technology will be specifically described. For example, as a solid-state imaging device 101, the solid-state imaging device according to any one embodiment among the first to fourth embodiments described above can be applied to all types of electronic devices equipped with an imaging function, such as, for example, a camera system such as a digital still camera or a video camera, a mobile phone having an imaging function, and the like. FIG. 7 shows a schematic configuration of an electronic device 102 (a camera) as an example. The electronic device 102 is, for example, a video camera capable of capturing a still image or a moving image, and has the solid-state imaging element 101, an optical system (an optical lens) 310, a shutter device 311, a drive unit 313 configured to drive the solid-state imaging device 101 and the shutter device 311, and a signal processing unit 312.

The optical system 310 guides image light (incident light) from a subject to a pixel unit 101a of the solid-state imaging device 101. The optical system 310 may include a plurality of optical lenses. The shutter device 311 controls a light irradiation period and a light shielding period for the solid-state imaging device 101. The drive unit 313 controls a transfer operation of the solid-state imaging device 101 and a shutter operation of the shutter device 311. The signal processing unit 312 performs various kinds of signal processing on a signal outputted from the solid-state imaging device 101. A video signal Dout after the signal processing is stored in a storage medium such as a memory, or is outputted to a monitor or the like.

Note that the embodiments of the present technology are not limited to the above-described embodiments, and various modifications can be made without departing from the scope of the present technology.

Furthermore, the effects described in this specification are merely examples and are not limited, and other effects may be present.

Furthermore, the present technology can also have the following configurations.

[1]
A solid-state imaging device including:
a first semiconductor element having
a first semiconductor layer provided with a first through via and a photoelectric conversion unit configured to photoelectrically convert light that has been incident,
a connection part that is wider than the first through via and is provided outside a region where the photoelectric conversion unit is provided on a surface of the first semiconductor layer on a side for receiving the light,
connection wiring provided on the surface and configured to connect the first through via and the connection part, and
a first passivation layer formed on the surface side;
a second semiconductor element mounted on the first semiconductor element by the connection part; and
a first guard ring formed on an outer peripheral portion of the first semiconductor element to surround the first semiconductor element, in which
at least a part of the first guard ring is arranged outside the first semiconductor layer and above a second semiconductor layer formed in substantially the same layer as the first semiconductor layer, and
the first guard ring is arranged outside the first passivation layer and below a second passivation layer formed in substantially the same layer as the first passivation layer.

[2]
The solid-state imaging device according to [1], in which the first guard ring is connected to the second semiconductor layer.

[3]
The solid-state imaging device according to [1] or [2], in which the first guard ring is connected to the second passivation layer.

[4]
The solid-state imaging device according to any one of [1] to [3], in which the first guard ring is a metal stack.

[5]
The solid-state imaging device according to any one of [1] to [4], in which the first guard ring includes at least one metal layer and a second through via penetrating the second semiconductor layer.

[6]
The solid-state imaging device according to any one of [1] to [4], in which the first guard ring includes at least one metal layer, a second through via penetrating the second semiconductor layer, and a via that connects the at least one metal layer and the second through via.

[7]
The solid-state imaging device according to any one of [1] to [4], in which
the first guard ring includes a metal layer having a recess, and a metal member extending in a direction substantially perpendicular to the metal layer,
the recess is connected to the second semiconductor layer, and
the metal layer having the recess is connected to the metal member.

[8]
The solid-state imaging device according to any one of [1] to [7], further including a second guard ring, in which
the second guard ring is configured by an insulating film and penetrates the second semiconductor layer, and is formed on an outer peripheral portion of the first guard ring to surround the first guard ring.

[9]
The solid-state imaging device according to any one of [1] to [8], further including a third guard ring, in which
the third guard ring is arranged below the second semiconductor layer, and is formed on an outer peripheral portion of the first semiconductor element to surround the first semiconductor element.

[10]
An electronic device installed with a solid-state imaging device, in which
the solid-state imaging device includes:
a first semiconductor element having
a first semiconductor layer provided with a first through via and a photoelectric conversion unit configured to photoelectrically convert light that has been incident,
a connection part that is wider than the first through via and is provided outside a region where the photoelectric conversion unit is provided on a surface of the first semiconductor layer on a side for receiving the light,
connection wiring provided on the surface and configured to connect the first through via and the connection part, and
a first passivation layer formed on the surface side;
a second semiconductor element mounted on the first semiconductor element by the connection part; and
a first guard ring formed on an outer peripheral portion of the first semiconductor element to surround the first semiconductor element,
at least a part of the first guard ring is arranged outside the first semiconductor layer and above a second semiconductor layer formed in substantially the same layer as the first semiconductor layer, and
the first guard ring is arranged outside the first passivation layer and below a second passivation layer formed in substantially the same layer as the first passivation layer.

[11]
An electronic device installed with the solid-state imaging device according to any one of [1] to [9].

REFERENCE SIGNS LIST

1 Guard ring part
2 Peripheral portion of first semiconductor element
3 (3-1, 3-2, 3-3) Third guard ring
4 Second semiconductor element (upper chip, companion chip)
12 (12-1, 12-3) Second guard ring
100, 200, 300, 400, 500 First guard ring
1000 (1000a, 1000b), 2000, 3000, 4000, 5000 Solid-state imaging device
1001 (1001a, 1001b), 2001, 3001, 4001, 5001 First semiconductor element (lower chip)

The invention claimed is:
1. A solid-state imaging device, comprising:
a first semiconductor element that includes:
a first semiconductor layer that includes:
a first through via; and
a photoelectric conversion unit in a region of the first semiconductor layer, wherein the photoelectric conversion unit is configured to photoelectrically convert light incident on a light incident surface side of the first semiconductor layer;

a connection part that is wider than the first through via, wherein the connection part is outside the region of the first semiconductor layer that includes the photoelectric conversion unit, the connection part includes a first metal layer and a second metal layer different from the first metal layer, and the second metal layer is on the first metal layer;

a connection wiring on the first semiconductor layer, wherein the connection wiring connects the first through via and the connection part; and a first passivation layer on the light incident surface side, wherein the first metal layer and the second metal layer are between the first passivation layer and the first semiconductor layer;

a second semiconductor element on the first semiconductor element, wherein the connection part is between the first semiconductor element and the second semiconductor element;

a second semiconductor layer;

a second passivation layer;

a first guard ring on an outer peripheral portion of the first semiconductor element, wherein the first guard ring surrounds the first semiconductor element, at least a part of the first guard ring is outside the first semiconductor layer and above the second semiconductor layer, and the first guard ring is outside the first passivation layer and below the second passivation layer; and a plurality of third guard rings below the second semiconductor layer, wherein at least a first of the plurality of third guard rings is connected in series to the first guard ring, and at least a second of the plurality of third guard rings is connected to the second semiconductor layer.

2. The solid-state imaging device according to claim 1, wherein the first guard ring is connected to the second semiconductor layer.

3. The solid-state imaging device according to claim 1, wherein the first guard ring is connected to the second passivation layer.

4. The solid-state imaging device according to claim 1, wherein the first guard ring is a metal stack.

5. The solid-state imaging device according to claim 1, wherein the first guard ring includes:

at least one metal layer; and a second through via that penetrates the second semiconductor layer.

6. The solid-state imaging device according to claim 1, wherein the first guard ring includes:

at least one metal layer;

a second through via that penetrates the second semiconductor layer; and a via that connects the at least one metal layer and the second through via.

7. The solid-state imaging device according to claim 1, wherein the first guard ring includes:

a third metal layer having a recess; and a metal member that extends in a direction substantially perpendicular to the third metal layer, wherein the recess is connected to the second semiconductor layer, and the third metal layer having the recess is connected to the metal member.

8. The solid-state imaging device according to claim 1, further comprising a second guard ring that penetrates the second semiconductor layer, wherein the second guard ring includes an insulating film, the second guard ring is on an outer peripheral portion of the first guard ring, and the second guard ring surrounds the first guard ring.

9. The solid-state imaging device according to claim 1, wherein the plurality of third guard rings is on the outer peripheral portion of the first semiconductor element, and the plurality of third guard rings surround the first semiconductor element.

10. An electronic device, comprising:

a solid-state imaging device that includes:

a first semiconductor element that includes:

a first semiconductor layer that includes:

a first through via; and a photoelectric conversion unit in a region of the first semiconductor layer, wherein the photoelectric conversion unit is configured to photoelectrically convert light incident on a light incident surface side of the first semiconductor layer;

a connection part that is wider than the first through via, wherein the connection part is outside the region of the first semiconductor layer that includes the photoelectric conversion unit, the connection part includes a first metal layer and a second metal layer different from the first metal layer, and the second metal layer is on the first metal layer;

a connection wiring on the first semiconductor layer, wherein the connection wiring connects the first through via and the connection part; and a first passivation layer on the light incident surface side, wherein the first metal layer and the second metal layer are between the first passivation layer and the first semiconductor layer;

a second semiconductor element on the first semiconductor element, wherein the connection part is between the first semiconductor element and the second semiconductor element;

a second semiconductor layer;

a second passivation layer;

a first guard ring on an outer peripheral portion of the first semiconductor element, wherein the first guard ring surrounds the first semiconductor element, the first guard ring is outside the first semiconductor layer and above the second semiconductor layer, and the first guard ring is outside the first passivation layer and below the second passivation layer; and a plurality of third guard rings below the second semiconductor layer, wherein at least a first of the plurality of third guard rings is connected in series to the first guard ring, and at least a second of the plurality of third guard rings is connected to the second semiconductor layer.

11. The solid-state imaging device according to claim 1, further comprising:

a first wiring on a first side of the first semiconductor layer; and a second wiring on a second side of the first semiconductor layer, wherein
the second side is opposite to the first side,
the first metal layer and the second metal layer are on the first wiring, and
the connection wiring is connected to the second wiring via the first through via.

* * * * *